US009531349B2

(12) United States Patent
Pugalia

(10) Patent No.: US 9,531,349 B2
(45) Date of Patent: Dec. 27, 2016

(54) SYSTEM AND METHOD FOR CONTROLLING RADIATED EMI USING INTERLEAVED FREQUENCY SWITCHING

(71) Applicant: Honeywell International, Inc., Morristown, NJ (US)

(72) Inventor: Alok Kumar Pugalia, Hyderabad (IN)

(73) Assignee: Honeywell International Inc., Morris Plains, NJ (US)

( * ) Notice: Subject to any disclaimer, the term of this patent is extended or adjusted under 35 U.S.C. 154(b) by 0 days.

(21) Appl. No.: 14/602,939

(22) Filed: Jan. 22, 2015

(65) Prior Publication Data

US 2016/0218698 A1 Jul. 28, 2016

(51) Int. Cl.
H03C 3/00 (2006.01)
H03C 3/40 (2006.01)
H03K 3/013 (2006.01)
H03L 7/00 (2006.01)

(52) U.S. Cl.
CPC .............. H03K 3/013 (2013.01); H03L 7/00 (2013.01)

(58) Field of Classification Search
USPC ................................................ 327/100–364
See application file for complete search history.

(56) References Cited

U.S. PATENT DOCUMENTS

| 5,659,339 | A | 8/1997 | Rindal et al. |
| 6,894,684 | B2 | 5/2005 | Shin et al. |
| 7,342,528 | B2 | 3/2008 | Ng et al. |
| 8,405,464 | B2 * | 3/2013 | Gibson ............... H03K 7/06 331/78 |
| 8,558,497 | B2 * | 10/2013 | Wright ............... H03K 7/08 318/34 |
| 9,098,283 | B2 * | 8/2015 | Busch ............... G06F 1/26 |
| 2003/0163748 | A1 | 8/2003 | Calkins et al. |
| 2007/0290894 | A1 | 12/2007 | Ng et al. |

(Continued)

FOREIGN PATENT DOCUMENTS

| JP | 2013-097496 | 5/2013 |
| KR | 10-2008-0025254 | 3/2008 |

(Continued)

OTHER PUBLICATIONS

International Search Report and Written Opinion issued for PCT/US2016/013342 dated Apr. 22, 2016, 9 pgs.

Primary Examiner — Brandon S Cole

(57) ABSTRACT

An apparatus includes a controller configured to be coupled to a system clock that generates a clock signal for a device that generates radiated electromagnetic interference (RE). The controller is also configured to determine a frequency span associated with the system clock, where the frequency span has a minimum frequency and a maximum frequency. The controller is further configured to determine a sequence of frequency steps, where each frequency step is associated with a distinct frequency within the frequency span. In addition, the controller is configured to control the system clock to change a frequency of the clock signal through the sequence of frequency steps in order to reduce the RE generated at or by the device. In some embodiments, the frequency steps are interleaved across the frequency span to avoid large frequency jumps. In some embodiments, the frequency step duration is optimally selected to reduce quasi peak values.

20 Claims, 6 Drawing Sheets

(56) References Cited

U.S. PATENT DOCUMENTS

2010/0090775 A1* 4/2010 Huda ................. H03K 7/08
332/117

FOREIGN PATENT DOCUMENTS

| KR | 10-2011-0078987 | 7/2011 |
|----|-----------------|--------|
| KR | 10-2013-0020073 | 2/2013 |
| KR | 10-1263185      | 5/2013 |

* cited by examiner

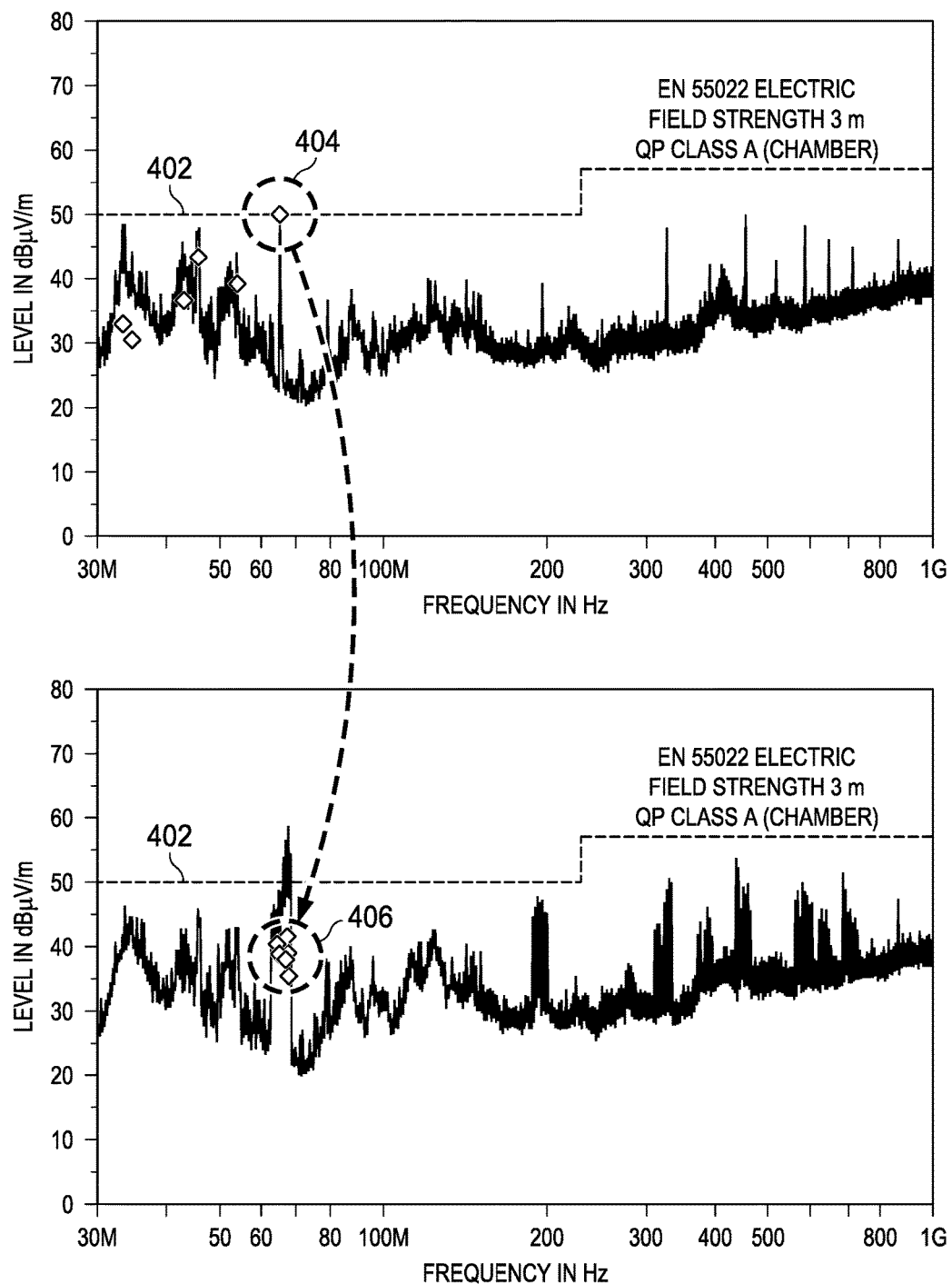

FINAL RESULT 1

| FREQUENCY (MHz) | QuasiPeak (dBµV/m) | MEAS. TIME (ms) | BANDWIDTH (kHz) | HEIGHT (cm) | POLARIZATION | AZIMUTH (deg) | CORR. (dB) | MARGIN (dB) | LIMIT (dBµV/m) |
|---|---|---|---|---|---|---|---|---|---|
| 33.400567 | 32.8 | 1000.0 | 120.000 | 100.0 | V | 30.0 | 9.8 | 17.2 | 50.0 |
| 34.496767 | 30.7 | 1000.0 | 120.000 | 100.0 | V | 90.0 | 9.8 | 19.3 | 50.0 |
| 43.055866 | 36.6 | 1000.0 | 120.000 | 100.0 | V | 150.0 | 9.4 | 13.4 | 50.0 |
| 45.813166 | 43.3 | 1000.0 | 120.000 | 100.0 | V | 0.0 | 9.4 | 6.7 | 50.0 |
| 45.841834 | 43.3 | 1000.0 | 120.000 | 100.0 | V | 0.0 | 9.4 | 6.7 | 50.0 |
| 54.073034 | 39.2 | 1000.0 | 120.000 | 100.0 | V | 270.0 | 10.1 | 10.8 | 50.0 |
| 65.010834 | 49.3 | 1000.0 | 120.000 | 200.0 | V | 0.0 | 9.3 | 0.7 | 50.0 |

NORMAL SCENARIO - NO SWITCHING

FINAL RESULT 1

| FREQUENCY (MHz) | QuasiPeak (dBµV/m) | MEAS. TIME (ms) | BANDWIDTH (kHz) | HEIGHT (cm) | POLARIZATION | AZIMUTH (deg) | CORR. (dB) | MARGIN (dB) | LIMIT (dBµV/m) |
|---|---|---|---|---|---|---|---|---|---|
| 64.142700 | 40.1 | 1000.0 | 120.000 | 300.0 | V | 330.0 | 9.3 | 9.9 | 50.0 |
| 64.482867 | 38.9 | 1000.0 | 120.000 | 200.0 | V | 150.0 | 9.3 | 11.1 | 50.0 |
| 65.899867 | 38.7 | 1000.0 | 120.000 | 200.0 | V | 210.0 | 9.2 | 11.3 | 50.0 |
| 66.389933 | 38.0 | 1000.0 | 120.000 | 200.0 | V | 90.0 | 9.1 | 12.0 | 50.0 |
| 66.579566 | 41.4 | 1000.0 | 120.000 | 200.0 | V | 90.0 | 9.1 | 8.6 | 50.0 |
| 66.967400 | 35.2 | 1000.0 | 120.000 | 200.0 | V | 90.0 | 9.0 | 14.8 | 50.0 |
| 67.008166 | 38.8 | 1000.0 | 120.000 | 200.0 | V | 300.0 | 9.0 | 11.2 | 50.0 |

WITH INTERLEAVED FREQUENCY SWITCHING

FIG. 4B

SYSTEM AND METHOD FOR CONTROLLING RADIATED EMI USING INTERLEAVED FREQUENCY SWITCHING

TECHNICAL FIELD

This disclosure relates generally to the control of electromagnetic interference (EMI). More specifically, this disclosure relates to a system and method for controlling radiated electromagnetic interference (R-EMI), or simply radiated emissions (RE), using interleaved frequency switching.

BACKGROUND

With ever-increasing data transmission rates, increasing transmission distances, and tighter cost constraints, controlling radiated electromagnetic interference (R-EMI, or simply RE) continues to be a challenge. Because RE adds signals to an already congested radio spectrum, the amount of permissible RE is subject to applicable governmental regulations.

The RE performance of a system may be evaluated by measuring equipment emissions within a narrow frequency reference window at individual frequencies. In the United States, applicable Federal Communications Commission (FCC) regulations dictate using a 120 KHz wide standard reference measurement window, which is swept from about 30 MHz to 1 GHz for purposes of making RE measurement. The International Special Committee on Radio Interference (CISPR) of the International Electrotechnical Commission (IEC) has promulgated similar regulations. Measurement involves a time integration of spectral energy of emissions occurring within the reference measurement window. A measured average emission magnitude at each frequency window is compared to published pre-specified limits, and a determination is made as to whether excessive RE is being radiated. If excessive RE is present, steps are taken to bring the RE-emitting system into compliance within acceptable emission limits.

SUMMARY

This disclosure provides a system and method for controlling radiated electromagnetic interference (R-EMI or simply RE) using interleaved frequency switching.

In a first embodiment, an apparatus includes a controller configured to be coupled to a system clock that generates a clock signal for a device that generates radiated electromagnetic interference (RE). The controller is also configured to determine a frequency span associated with the system clock, where the frequency span has a minimum frequency and a maximum frequency. The controller is further configured to determine a sequence of frequency steps, where each frequency step is associated with a distinct frequency within the frequency span. In addition, the controller is configured to control the system clock to change a frequency of the clock signal through the sequence of frequency steps in order to reduce the RE generated at or by the device.

In a second embodiment, a method includes determining a frequency span associated with a system clock that generates a clock signal for a device that generates RE, where the frequency span has a minimum frequency and a maximum frequency. The method also includes determining a sequence of frequency steps, where each frequency step is associated with a distinct frequency within the frequency span. The method further includes controlling the system clock to change a frequency of the clock signal through the sequence of frequency steps in order to reduce the RE generated at or by the device.

In a third embodiment, a non-transitory computer readable medium embodies a computer program. The computer program includes computer readable program code for determining a frequency span associated with a system clock that generates a clock signal for a device that generates RE, where the frequency span has a minimum frequency and a maximum frequency. The computer program also includes computer readable program code for determining a sequence of frequency steps, where each frequency step is associated with a distinct frequency within the frequency span. The computer program further includes computer readable program code for controlling the system clock to change a frequency of the clock signal through the sequence of frequency steps in order to reduce the RE generated at or by the device.

In some embodiments, the frequency steps are interleaved across the frequency span to avoid large frequency jumps.

In some embodiments, a frequency interval between adjacent frequencies in the sequence of frequency steps is determined based on an intermediate frequency (IF) filter bandwidth required by an International Special Committee on Radio Interference (CISPR) standard. The frequency interval may be determined such that no two adjacent frequencies in the sequence fall within a single IF filter bandwidth.

In some embodiments, a duration of each frequency step is determined based on the number of frequency steps and the total cycle time. The number of frequency steps and the total cycle time are optimally selected based on one or more of: a quasi peak dwell time, a quasi peak decay time, and a time for a phased lock loop to lock.

Other technical features may be readily apparent to one skilled in the art from the following figures, descriptions, and claims.

BRIEF DESCRIPTION OF THE DRAWINGS

For a more complete understanding of this disclosure, reference is now made to the following description, taken in conjunction with the accompanying drawings, in which:

FIGS. 4A and 4B illustrate example results of an interleaved frequency switching method that significantly reduces RE according to this disclosure;

DETAILED DESCRIPTION

Figure 1:
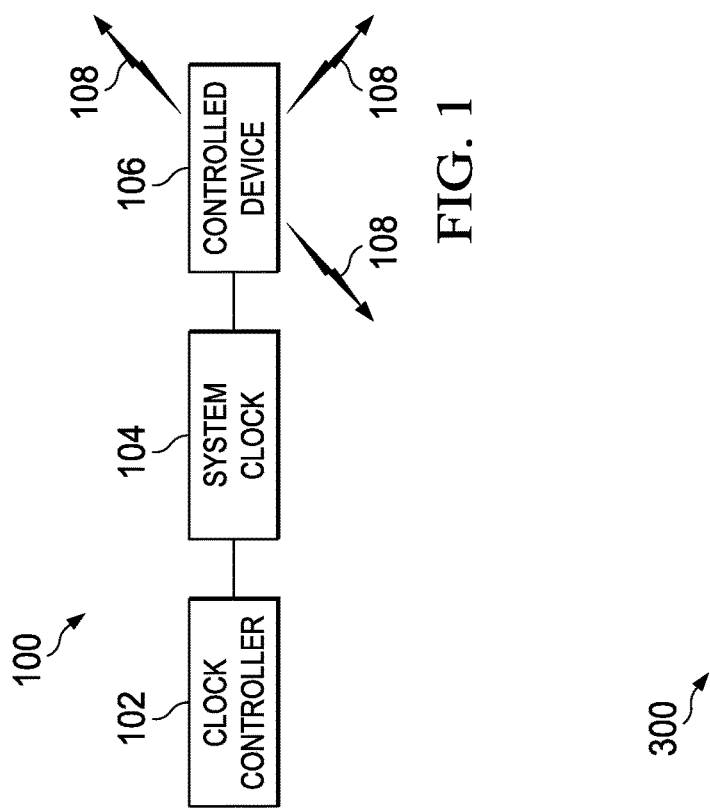
FIG. 1 illustrates an example system for controlling radiated electromagnetic interference (R-EMI or RE) by controlling a system clock according to this disclosure.

FIGS. 1 through 7, discussed below, and the various embodiments used to describe the principles of the present invention in this patent document are by way of illustration only and should not be construed in any way to limit the scope of the invention. Those skilled in the art will understand that the principles of the invention may be implemented in any type of suitably arranged device or system.

A variety of techniques for controlling radiated electromagnetic interference (R-EMI or simply RE) have been used with limited success or with limited applicability. For example, in a liquid crystal display (LCD), RE is generated as a byproduct of a clock signal associated with a display signal. A clocking frequency of the clock signal typically needs to meet strict timing constraints for an acceptable display performance. Some spread spectrum (SS) techniques have been used to reduce RE, but such techniques are of limited benefit due to the following reasons.

RE measurements are typically performed to assess the "annoyance factor" of RE noise. The RE measurements include measuring quasi peaks with an intermediate frequency (IF) filter bandwidth (BW) around 100 kHz to 150 kHz. In some SS techniques, the frequency is spread to approximately a few hundred parts per million (ppm) of the center frequency, which is typically at tens of mega-Hertz. As a result, the entire spread at best falls within a couple of IF filter bandwidths, and the entire spread may fall within a single bandwidth in the worst case. In either case, the quasi peak measurement shows little or no improvement compared to a normal clocking scenario since power remains concentrated in one or two bands only instead of spreading out. Furthermore, due to frequency switching, the peaks associated with SS might actually go higher than clocking without SS.

Moreover, in some SS techniques, the quasi peak value depends on the peak amplitude, repetition rate, and duration of the peak. Quasi peak detectors have an attack time on the order of milliseconds (such as 1 ms for CISPR 11) and a decay time on the order of a few hundred milliseconds (such as 500 ms for CISPR 11). In order to achieve an optimum reduction in the quasi peak, the repetition rate and duration of the clock should be chosen properly. If the frequency is switched too fast (which is the case in many SS techniques) or too slow, it is highly likely that the quasi peak will not show any reduction in the measured value.

Another issue that is typically seen when attempting to perform frequency switching or spreading in LCDs is display flickering. This is typically due to clock timings not being aligned, which can occur for a number of reasons. For example, a phase locked loop (PLL) may not be able to track or lock due to fast switching and/or large jumps in frequency. As another example, the associated frequency jumps and/or spread may fall outside of the timing constraint window.

In other systems, some methods seek to limit RE using, for example, conductive coatings, ferrite clamps, or shielded wires. Such methods require extra hardware or materials, thus increasing costs and limiting feasibility. Other methods seek to reduce RE using, for example, slew rate reduction, phase modulation, impedance matching, or frequency hopping. However, such methods typically result in significant complexity and may offer minimal RE reduction. Also, depending on the complexity, such methods may not always be feasible to implement in an available piece of hardware.

To address these issues, embodiments of this disclosure control RE by manipulating a system clock. In some embodiments, these approaches can be implemented in software or firmware in existing microcontroller- or microprocessor-based systems without any extra hardware. These approaches thus reduce or eliminate dependency on external components, thereby reducing costs and resulting in a simpler designs. The approaches disclosed here are generally applicable to any suitable microcontroller- or microprocessor-based clocked data transmission systems. For ease of explanation, certain embodiments are described specifically in connection with systems driving an LCD (which is one of the most commonly available display types), although the approaches described here could be used in any other suitable system.

FIG. 1 illustrates an example system 100 for controlling RE by controlling a system clock according to this disclosure. As shown in FIG. 1, the system 100 includes a clock controller 102, a system clock 104, and a controlled device 106. The controlled device 106 represents a device that transmits or receives data and that operates under the control of the system clock 104. In some embodiments, the controlled device 106 represents an LCD display.

One aspect of the controlled device 106 is that it generates RE 108 as a result of its operation. For example, an LCD (or one or more components associated with the LCD) often generates RE as a byproduct when operating to display an image. In some cases, this RE can significantly affect image quality or cause problems with nearby electronics. Thus, it is desirable to adjust the operation of the controlled device 106 to reduce the generated RE.

The system clock 104 generates a clock signal associated with operation of the controlled device 106. For example, the clock signal may be used to time a command signal that is transmitted to the controlled device 106. A frequency of the clock signal generated by the system clock 104 can be adjusted according to instructions received from the clock controller 102.

The clock controller 102 controls the system clock 104 to rapidly change its clock frequency. In some embodiments, the clock controller 102 controls the system clock 104 by transmitting command signals or instructions to the system clock 104 in order to change the clock frequency. Sufficiently rapid frequency changes reduce the amount of time that frequency components fall within the narrow RE-compliance reference bandwidth. Since RE measurements represent an integration of spectral energy over time, reducing the time that spectral components fall within the reference bandwidth reduces their RE contribution.

In accordance with this disclosure, the clock controller 102 controls the system clock 104 to change the frequency of its clock signal using an interleaved frequency switching technique. Interleaving of the frequency steps as described below avoids large jumps in frequency even for large spreads. This results in good operational performance for an LCD or other device, even for a large overall frequency spread. The clock controller 102 controls the duration, repetition rate, and spread of the steps by optimizing on multiple parameters, resulting in significant RE reduction.

In some embodiments, the clock controller 102 performs a method to determine a set of interleaved frequencies for switching the system clock 104 in order to reduce RE generated by the controlled device 106. Such a method is described with respect to FIG. 2 below.

Although FIG. 1 illustrates one example of a system 100 for controlling RE using an interleaved frequency switching technique, various changes may be made to FIG. 1. For example, various components in FIG. 1 could be combined, further subdivided, or omitted and additional components could be added according to particular needs. As a particular example, various components of the clock controller 102, the system clock 104, and the controlled device 106 could be arranged together in one housing or on one circuit board.

Figure 2:
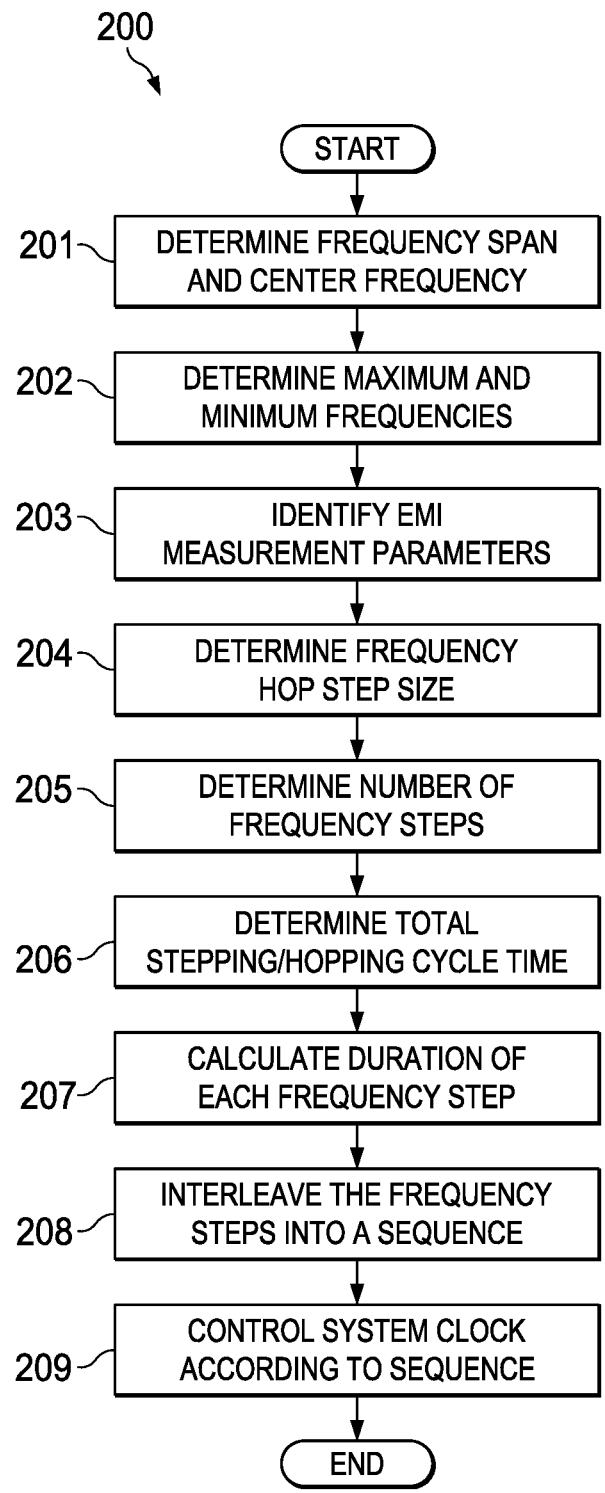
FIG. 2 illustrates an example method for controlling RE using interleaved frequency switching in accordance with this disclosure.

FIG. 2 illustrates an example method 200 for controlling RE using interleaved frequency switching in accordance with this disclosure. For convenience, the method 200 is described as being performed by the clock controller 102 in association with the system 100 of FIG. 1. However, the method 200 could be used with any other suitable device and in any other suitable system.

At step 201, the clock controller 102 identifies a center frequency $f_C$ of the system clock 104 that allows for a maximum span $f_{SPAN}$. The center frequency $f_C$ may be provided by a user or engineer at runtime or during a maintenance window; read from a file, table, or other data structure; or otherwise obtained in any suitable manner. In some embodiments, the allowed span $f_{SPAN}$ may be determined based on the capability of the controlled device 106, such as described in its datasheet. In the case of an LCD, the allowed maximum span $f_{SPAN}$ may be determined by one or more timing parameters associated with the LCD, such as the span for which those parameters do not change outside the allowed limit.

At step 202, the clock controller 102 validates that the performance of the system 100 meets the requirements with specified frequency extremes $f_{MAX}$ and $f_{MIN}$ without any hardware change. Minor changes in firmware that can be performed at runtime are acceptable. The frequency extremes $f_{MAX}$ and $f_{MIN}$ could be determined as follows:

$$f_{MAX} = f_C + f_{SPAN}/2 \quad (1)$$

$$f_{MIN} = f_C - f_{SPAN}/2 \quad (2)$$

At step 203, based on electromagnetic compliance (EMC) certification requirements, the clock controller 102 identifies various parameters related to an RE measurement, such as:

IF filter BW: $f_{BW}$ (120 kHz for CISPR 11);
QP (Quasi Peak) dwell time: $t_{DWELL}$ (minimum of 1s for CISPR 11);
QPD (Quasi Peak Detector) Attack time: $t_{ATTACK}$ (1 ms for CISPR 11);
QPD Decay time: $t_{DECAY}$ (500 ms for CISPR 11).

These parameters may be provided by a user or engineer at runtime or during a maintenance window; read from a file, table, or other data structure; or otherwise obtained in any suitable manner.

At step 204, the clock controller 102 selects a frequency hop step size $f_{STEP}$. In some embodiments, the frequency hop step size $f_{STEP}$ is calculated as:

$$f_{STEP} = 1.5 \times f_{BW} \text{ to } 2.5 \times f_{BW} \quad (3)$$

The frequency hop step size $f_{STEP}$ can be selected for optimum power distribution. In general, a larger step results in a better power distribution. However, because the overall spread is fixed, the number of steps is reduced as the step size is increased.

At step 205, the clock controller 102 calculates a number of frequency steps $N_{STEPS}$, which could occur as follows:

$$N_{STEPS} = \text{ROUND}(f_{SPAN}/f_{STEP}) + 1 \quad (4)$$

An additional step can be accommodated since both extremes are included in the frequency steps. A small overshoot outside of the span normally does not create an issue. In such cases, the number of frequency steps $N_{STEPS}$ can be determined according to the following alternative:

$$N_{STEPS} = \text{FLOOR}(f_{SPAN}/f_{STEP}) + 1 \quad (5)$$

The values $N_{STEPS}$ and $f_{STEP}$ can be interdependently selected (such as using an iterative process) until suitable values for $f_{STEP}$ and $f_{SPAN}$ are determined At step 206, the clock controller 102 determines a total stepping/hopping cycle time $t_{CYCLE}$ needed to cycle the frequencies through the entire spread once. To reduce the footprint for each frequency over the dwell time of the QP measurement, it may be desirable to keep the total time $t_{CYCLE}$ limited, such as equal to 1.5 to 2.5 times the dwell time or 3 to 5 times the decay time (whichever is higher). This ensures good reproducibility of the lowered RE peaks and, at the same time, does not require a large duration for a single step. Stated in equation form, $t_{CYCLE}$ can be determined as follows:

$$t_{CYCLE} = \text{MAX}(1.5 \times t_{DWELL} \text{ to } 2.5 \times t_{DWELL}; \\ 3 \times t_{DECAY} \text{ to } 5 \times t_{DECAY}) \quad (6)$$

At step 207, the clock controller 102 calculates the duration of each individual step $t_{STEP}$, which could be done as follows:

$$t_{STEP} = t_{CYCLE}/N_{STEPS} \quad (7)$$

The value of $t_{STEP}$ may ideally be as small as possible, which can help to ensure a minimum footprint for each frequency step. In some embodiments, the value of $t_{STEP}$ could be at least five times the time $t_{LOCK}$ it takes for a PLL to lock (which is typically on the order of a few hundreds of microseconds). On the higher side, $t_{STEP}$ could give ample time for the QPD value to decay during an off period (such as the time when other frequencies are being stepped). In particular embodiments, a value of at least four times $t_{DECAY}$ is a good choice. Because this may be an important constraint to adhere to, $t_{STEP}$ can be increased if required.

In determining the value of $t_{STEP}$, the following constraint may also be met if possible:

$$t_{CYCLE} - t_{STEP} > 4 \times t_{DECAY} \quad (8)$$

In some embodiments, this constraint should be met, but it could be relaxed somewhat when other constraints are difficult to meet. The values $N_{STEPS}$ and $t_{STEP}$ can be calculated interdependently (such as by using an iterative process) until suitable values for $t_{STEP}$ and $t_{CYCLE}$ are determined.

At step 208, the clock controller 102 sequences the frequency steps so that they are interleaved. This could occur as indicated below. For embodiments where the value of $N_{STEPS}$ is odd:

$f_1 = f_{MIN}$
$f_{N+1} = f_N + 2 \times f_{STEP}$; N=1 to $(N_{STEPS}-1)/2$ (this is when $f_{MAX}$ is reached)
$f_N = f_{MAX} - f_{STEP}$; N=$(N_{STEPS}+1)/2 + 1$
$f_{N+1} = f_N - 2 \times f_{STEP}$; N=$(N_{STEPS}+3)/2$ to $N_{STEPS}-1$ The sequence is cycled back after this by reducing $f_{STEP}$ from the final step as $f_1$ and $f_{NSTEPS}$ are related (as in $f_1 = f_{NSTEPS} - f_{STEP}$). For embodiments where the value of $N_{STEPS}$ is even:

$f_1 = f_{MIN}$
$f_{N+1} = f_N + 2 \times f_{STEP}$; N=1 to $(N_{STEPS}/2 - 1)$
$f_{N+1} = f_N + f_{STEP}$; N=$N_{STEPS}/2$ (this is when $f_{MAX}$ is reached)
$f_{N+1} = f_N - 2 \times f_{STEP}$; N=$(N_{STEPS}/2 + 1)$ to $N_{STEPS}-1$ The sequence is cycled back after this by reducing $f_{STEP}$ from the final step as $f_1$ and $f_{NSTEPS}$ are related (as in $f_1 = f_{NSTEPS} - f_{STEP}$).

At step 209, the clock controller 102 implements this sequencing. This can be accomplished by controlling the clock frequency of the system clock 104 according to the sequence, with the duration of each step as $t_{STEP}$.

The method 200 could be implemented in any suitable manner, such as by using hardware or a combination of software/firmware and hardware. In some embodiments, for example, the method 200 can be enabled in firmware using an interrupt service routine (ISR), where a frequency register or control can be updated.

The RE can be measured after this method 200 to validate the reduction in quasi peaks. However, it should be noted that actual RE reduction may be lower than expected due to peaking that occurs because of switching. If conditions require further RE reduction, the annoyance factor could be reduced by improving any one or more of the above-mentioned conditions.

To better illustrate the method 200, the following example implementation of the method 200 is provided. At step 201, assume the center frequency is identified as $f_C$=64.9 MHz and the maximum span is determined as $f_{SPAN}$=4.6 MHz. However, the maximum span is selected as $f_{SPAN}$=4.4 MHz in order to have some margin of safety. At step 202, assume the frequency extremes are determined as $f_{MAX}$=67.1 MHz and $f_{MIN}$=62.7 MHz. At step 203, the following parameters can be determined based on CISPR 11 requirements:

IF filter BW: $f_{BW}$=120 kHz
QP (Quasi Peak) dwell time: $t_{DWELL}$=1 s
QPD (Quasi Peak Detector) Attack time: $t_{ATTACK}$=1 ms
QPD Decay time: $t_{DECAY}$=500 ms.

At step 204, the frequency hop step size can be determined as $f_{STEP}$=200 kHz (1.67×$f_{BW}$). At step 205, the number of frequency steps can be determined as $N_{STEPS}$=ROUND ($f_{SPAN}$/$f_{STEP}$)+1=23. At step 206, the total stepping/hopping cycle time can be determined as $t_{CYCLE}$=MAX(1.5×$t_{DWELL}$ to 2.5×$t_{DWELL}$; 3×$t_{DECAY}$ to 5×$t_{DECAY}$)=1.5 s to 2.5 s. At step 207, the duration of each individual step can be determined as $t_{STEP}$=$t_{CYCLE}$/$N_{STEPS}$=65 ms to 109 ms. It may be known that the time for a PLL to lock is $t_{LOCK}$=1 ms, so the value of $t_{STEP}$ would be greater than five times $t_{LOCK}$ (such as $t_{STEP}$>5 ms (5×1 ms)). To meet the constraint $t_{CYCLE}$−$t_{STEP}$>4×$t_{DECAY}$ (2 s), $t_{STEP}$ can be selected to be $t_{STEP}$=100 ms, thereby giving $t_{CYCLE}$=2.3 s. At step 208, the frequency steps in the sequence can be determined and interleaved based on the values below:

$f_{MIN}$=62.7 MHz
$f_{MAX}$=67.1 MHz
$f_{STEP}$=200 kHz
$N_{STEPS}$=23
$t_{STEP}$=100 ms.

Figure 3:
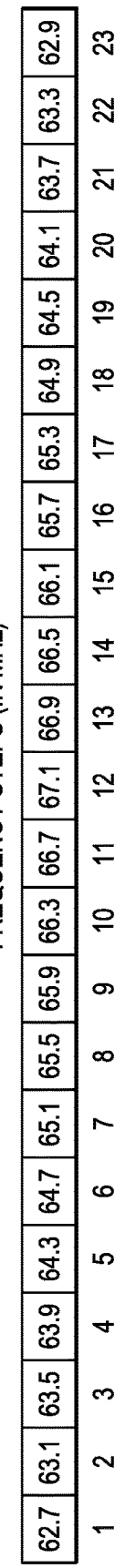
FIG. 3 illustrates an example interleaved sequence of frequency steps generated using an interleaved frequency switching technique according to this disclosure.

This particular interleaved sequence of frequency steps 300 is illustrated in FIG. 3, where the frequency at each step is given in MHz. As can be seen by the sequence, there are a total of 23 frequency steps ($N_{STEPS}$). The first step is 62.7 MHz ($f_1$=$f_{MIN}$), the highest frequency (which occurs in this example at step 12) is 67.1 MHz ($f_{MAX}$), and the interval between represented frequencies in the sequence is 200 kHz ($f_{STEP}$). The interval between most adjacent frequency steps is 400 MHz (2×$f_{STEP}$), but the interval between the 12$^{th}$ and 13$^{th}$ frequency steps is only 200 MHz ($f_{STEP}$).

As can be seen in this example, the frequencies are selected such that no two adjacent frequencies fall within a single IF bandwidth. This can help to ensure an optimum power distribution to reduce RE significantly. Also, the frequencies are interleaved and steadily rise and fall along the sequence such that adjacent frequencies do not represent a significant jump. This includes going from the last frequency in a sequence (62.9 MHz) to the first frequency in the next sequence (62.7 MHz). Thus, large jumps in frequency are avoided, even for large overall spreads of frequency.

Although FIG. 2 illustrates one example of a method 200 for controlling RE using interleaved frequency switching, various changes may be made to FIG. 2. For example, while shown as a series of steps, various steps shown in FIG. 2 could overlap, occur in parallel, occur in a different order, or occur multiple times. Moreover, some steps could be combined or removed and additional steps could be added according to particular needs. Although FIG. 3 illustrates one example of an interleaved sequence of frequency steps 300 generated using an interleaved frequency switching technique, various changes may be made to FIG. 3.

While the method 200 has been described as identifying a sequence of frequencies that rise from a minimum frequency to a maximum frequency and then descend to the minimum frequency again, other arrangements of frequencies in the sequence are possible. For example, the sequence of frequencies could start at the maximum frequency, descend to the minimum frequency, and then rise to approximately the maximum frequency at the end of the sequence. That is, instead of a "mountain" sequence (low-high-low), the sequence of frequencies could be a "valley" sequence (high-low-high). Other frequency sequences may also be suitable, such as low-high-low-high-low.

The time duration of each frequency step can be selected to be adequately large for a PLL to lock and settle, thereby lowering a repetition rate. However, the time duration is also kept small enough to provide an optimum ON duration. This ensures lower quasi peak values. Also, there are enough frequency steps to help ensure that (1) the repetition rate is low enough for a good RE reduction while (2) the overall spread is limited to be within the timing constraint window of the RE-producing controlled device 106 (such as an LCD display).

FIGS. 4A and 4B illustrate example results of an interleaved frequency switching method that significantly reduces RE according to this disclosure. As shown in FIGS. 4A and 4B, the method 200 can result in a significant reduction in RE. In FIG. 4A, a stepped horizontal line 402 represents a quasi peak limit for RE according to the CISPR 11 standard. As indicated at region 404 in FIG. 4A, a quasi peak measurement in a system with no interleaved frequency switching is very near the acceptable limit for that frequency. In contrast, the system, when modified to use interleaved frequency switching (such as in the system 100), results in quasi peak measurements several dB below the limit as indicated at region 406 in FIG. 4A. FIG. 4B provides numerical results associated with the two approaches.

Figure 5:
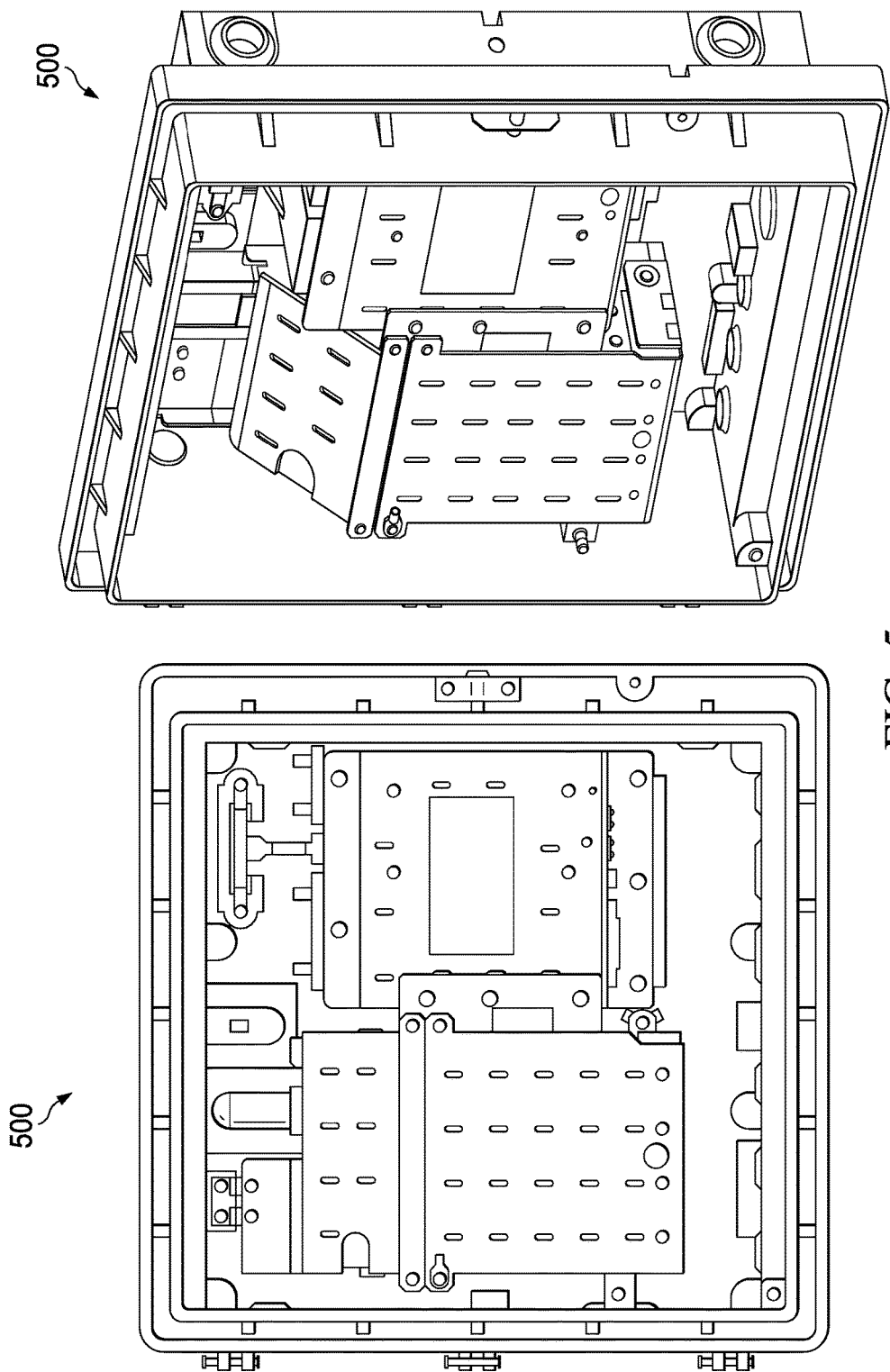
FIG. 5 illustrates front and perspective views of an example electronics housing for electronics that use an interleaved frequency switching method according to this disclosure.

In some embodiments, the reduction in RE using the method 200 can allow for reduced electronics packaging or housing costs. For example, FIG. 5 illustrates front and perspective views of an electronics housing 500 for electronics that use the method 200 according to this disclosure. Because RE is reduced, the electronics in the housing 500 do not require certain kinds of conductive coating and can be spaced closer together. This allows for a slimmer, lower-profile housing 500. Also, the housing 500 can be formed of plastic, instead of one or more RE-shielding metals, thereby reducing overall cost and weight.

Figure 6:
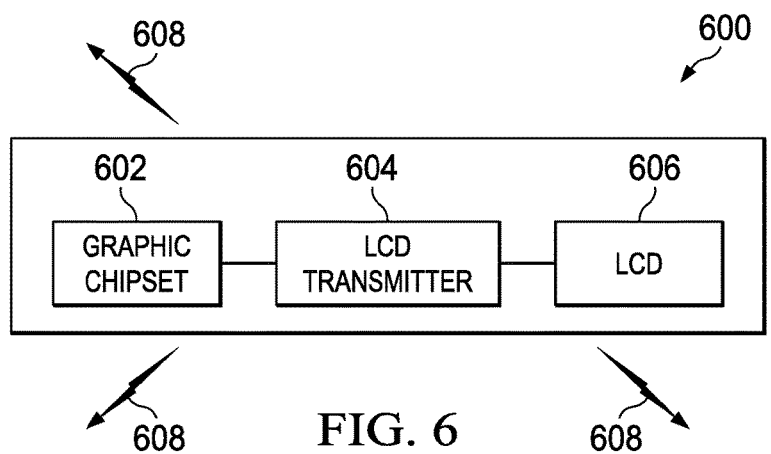
FIG. 6 illustrates an example display configured for operation using an interleaved frequency switching technique according to this disclosure.

FIG. 6 illustrates an example display 600 configured for operation using an interleaved frequency switching technique according to this disclosure. The display 600 could, for example, represent the controlled device 106 in the system 100 of FIG. 1. As shown in FIG. 6, the display 600 includes a graphic chipset 602, an LCD transmitter 604, and an LCD 606. The display 600 receives one or more data signals and clock signals and uses the signals at the graphic chipset 602 and the LCD transmitter 604 in order to generate images at the LCD 606. For example, the display 600 can receive one or more clock signals from a system clock, such as the system clock 104. The LCD 606 and the LCD transmitter 604 may be connected together through one or more connectors or cable harnesses as known in the art.

The display 600 generates RE 608 during its operation. For example, the display 600 can generate the RE 608 while displaying an image at the LCD 606. In accordance with this disclosure, the RE 608 can be mitigated by performing interleaved frequency switching on one or more clock signals associated with generating the display at the LCD 606.

Although FIG. 6 illustrates one example of a display 600 configured for operation using an interleaved frequency switching technique, various changes may be made to FIG. 6. For example, various components in FIG. 6 could be combined, further subdivided, or omitted and additional components could be added according to particular needs.

Figure 7:
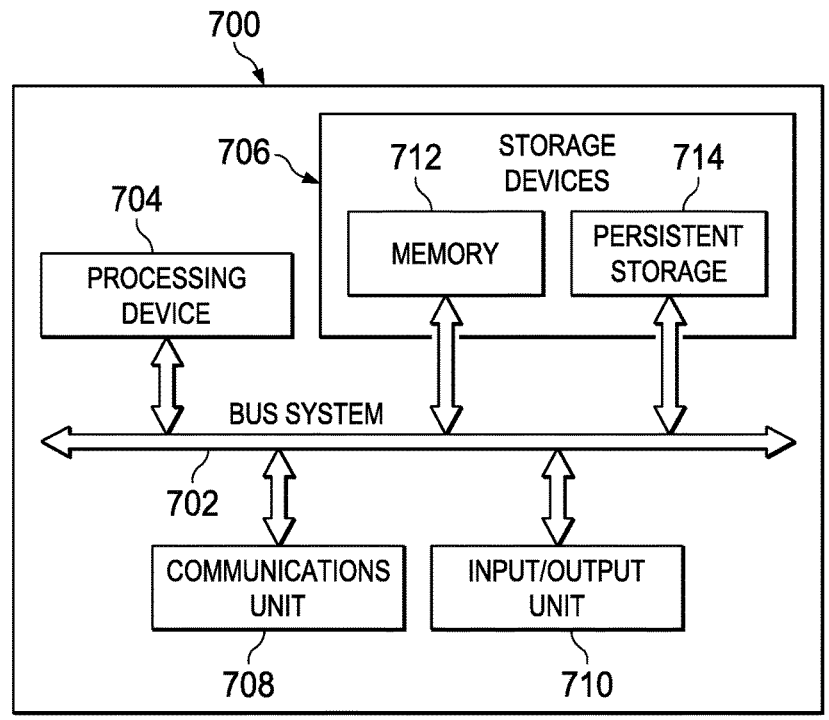
FIG. 7 illustrates an example device for controlling a system clock for interleaved frequency switching according to this disclosure.

FIG. 7 illustrates an example device 700 for controlling a system clock for interleaved frequency switching according to this disclosure. The device 700 could, for example, represent a computing device that implements the system 100 of FIG. 1. The device 700 could represent any other suitable device for controlling a system clock.

As shown in FIG. 7, the device 700 can include a bus system 702, which supports communication between at least one processing device 704, at least one storage device 706, at least one communications unit 708, and at least one input/output (I/O) unit 710. The processing device 704 executes instructions that may be loaded into a memory 712. The processing device 704 may include any suitable number(s) and type(s) of processors or other devices in any suitable arrangement. Example types of processing devices 704 include microprocessors, microcontrollers, digital signal processors, field programmable gate arrays, application specific integrated circuits, and discrete circuitry.

The memory 712 and a persistent storage 714 are examples of storage devices 706, which represent any structure(s) capable of storing and facilitating retrieval of information (such as data, program code, and/or other suitable information on a temporary or permanent basis). The memory 712 may represent a random access memory or any other suitable volatile or non-volatile storage device(s). The persistent storage 714 may contain one or more components or devices supporting longer-term storage of data, such as a ready only memory, hard drive, Flash memory, or optical disc. In accordance with this disclosure, the memory 712 and the persistent storage 714 may be configured to store instructions associated with controlling a system clock for interleaved frequency switching.

The communications unit 708 supports communications with other systems or devices, such as the system clock 104. For example, the communications unit 708 could include a network interface card that facilitates communications over at least one Ethernet network. The communications unit 708 could also include a wireless transceiver facilitating communications over at least one wireless network. The communications unit 708 may support communications through any suitable physical or wireless communication link(s).

The I/O unit 710 allows for input and output of data. For example, the I/O unit 710 may provide a connection for user input through a keyboard, mouse, keypad, touchscreen, or other suitable input device. The I/O unit 710 may also send output to a display, printer, or other suitable output device.

Although FIG. 7 illustrates one example of a device 700 for controlling a system clock for interleaved frequency switching, various changes may be made to FIG. 7. For example, various components in FIG. 7 could be combined, further subdivided, or omitted and additional components could be added according to particular needs. Also, control devices can come in a wide variety of configurations, and FIG. 7 does not limit this disclosure to any particular configuration of control device.

In some embodiments, various functions described above are implemented or supported by a computer program that is formed from computer readable program code and that is embodied in a computer readable medium. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

It may be advantageous to set forth definitions of certain words and phrases used throughout this patent document. The terms "application" and "program" refer to one or more computer programs, software components, sets of instructions, procedures, functions, objects, classes, instances, related data, or a portion thereof adapted for implementation in a suitable computer code (including source code, object code, or executable code). The terms "transmit," "receive," and "communicate," as well as derivatives thereof, encompass both direct and indirect communication. The terms "include" and "comprise," as well as derivatives thereof, mean inclusion without limitation. The term "or" is inclusive, meaning and/or. The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The term "controller" means any device, system, or part thereof that controls at least one operation. A controller may be implemented in hardware or a combination of hardware and software/firmware. The functionality associated with any particular controller may be centralized or distributed, whether locally or remotely. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:
1. An apparatus comprising:
a controller configured to be coupled to a system clock that generates a clock signal for a device that generates radiated electromagnetic interference (RE), the controller also configured to:

determine a frequency span associated with the system clock, the frequency span having a minimum frequency and a maximum frequency;

determine a frequency step size based on an intermediate frequency (IF) filter bandwidth;

determine a number of frequency steps based on the frequency span and the frequency step size;

determine a total cycle time for the system clock to cycle through a sequence of frequency steps;

determine a duration of each frequency step based on the number of frequency steps and the total cycle time;

determine the sequence of frequency steps by interleaving the frequency steps across the frequency span, each frequency step associated with a distinct frequency within the frequency span; and control the system clock to change a frequency of the clock signal through the sequence of frequency steps in order to reduce the RE generated at or by the device.

2. The apparatus of claim 1, wherein the total cycle time is based on at least one of a quasi peak dwell time and a quasi peak decay time.

3. The apparatus of claim 1, wherein the distinct frequencies in the sequence of frequency steps vary from the minimum frequency to the maximum frequency.

4. The apparatus of claim 1, wherein the frequency span is determined based on one or more timing parameters associated with the device.

5. The apparatus of claim 1, wherein:
a frequency interval between adjacent frequencies in the sequence of frequency steps is determined based on the IF filter bandwidth; and
the IF filter bandwidth is required by an International Special Committee on Radio Interference (CISPR) standard.

6. The apparatus of claim 5, wherein the frequency interval is determined such that no two adjacent frequencies in the sequence fall within a single bandwidth equal to the IF filter bandwidth.

7. The apparatus of claim 1, wherein the device is a display device.

8. A method comprising:
determining a frequency span associated with a system clock that generates a clock signal for a device that generates radiated electromagnetic interference (RE), the frequency span having a minimum frequency and a maximum frequency;

determining a frequency step size based on an intermediate frequency (IF) filter bandwidth;

determining a number of frequency steps based on the frequency span and the frequency step size;

determining a total cycle time for the system clock to cycle through a sequence of frequency steps;

determining a duration of each frequency step based on the number of frequency steps and the total cycle time;

determining the sequence of frequency steps by interleaving the frequency steps across the frequency span, each frequency step associated with a distinct frequency within the frequency span; and controlling the system clock to change a frequency of the clock signal through the sequence of frequency steps in order to reduce the RE generated at or by the device.

9. The method of claim 8, wherein the total cycle time is based on at least one of a quasi peak dwell time and a quasi peak decay time.

10. The method of claim 8, wherein the distinct frequencies in the sequence of frequency steps vary from the minimum frequency to the maximum frequency.

11. The method of claim 8, wherein the frequency span is determined based on one or more timing parameters associated with the device.

12. The method of claim 8, wherein:
a frequency interval between adjacent frequencies in the sequence of frequency steps is determined based on the IF filter bandwidth; and
the IF filter bandwidth is required by an International Special Committee on Radio Interference (CISPR) standard.

13. The method of claim 12, wherein the frequency interval is determined such that no two adjacent frequencies in the sequence fall within a single bandwidth equal to the IF filter bandwidth.

14. The method of claim 8, wherein the device is a display device.

15. A non-transitory computer readable medium embodying a computer program, the computer program comprising computer readable program code for:
determining a frequency span associated with a system clock that generates a clock signal for a device that generates radiated electromagnetic interference (RE), the frequency span having a minimum frequency and a maximum frequency;

determining a frequency step size based on an intermediate frequency (IF) filter bandwidth;

determining a number of frequency steps based on the frequency span and the frequency step size;

determining a total cycle time for the system clock to cycle through a sequence of frequency steps;

determining a duration of each frequency step based on the number of frequency steps and the total cycle time;

determining the sequence of frequency steps by interleaving the frequency steps across the frequency span, each frequency step associated with a distinct frequency within the frequency span; and controlling the system clock to change a frequency of the clock signal through the sequence of frequency steps in order to reduce the RE generated at or by the device.

16. The non-transitory computer readable medium of claim 15, wherein the total cycle time is based on at least one of a quasi peak dwell time and a quasi peak decay time.

17. The non-transitory computer readable medium of claim 15, wherein the distinct frequencies in the sequence of frequency steps vary from the minimum frequency to the maximum frequency.

18. The non-transitory computer readable medium of claim 15, wherein the frequency span is determined based on one or more timing parameters associated with the device.

19. The non-transitory computer readable medium of claim 15, wherein:
a frequency interval between adjacent frequencies in the sequence of frequency steps is determined based on the IF filter bandwidth; and
the IF filter bandwidth is required by an International Special Committee on Radio Interference (CISPR) standard.

20. The non-transitory computer readable medium of claim 19, wherein the frequency interval is determined such that no two adjacent frequencies in the sequence fall within a single bandwidth equal to the IF filter bandwidth.

* * * * *